United States Patent
Anderson et al.

(10) Patent No.: US 9,954,411 B2
(45) Date of Patent: Apr. 24, 2018

(54) ACTUATING DRIVE HAVING AN ELECTRICAL PLUG-IN CONNECTION

(71) Applicant: SIEMENS SCHWEIZ AG, Zurich (CH)

(72) Inventors: Dean B. Anderson, Wonder Lake, IL (US); Christian Grossenbacher, Waltenschwil (CH); Beat Kaelin, Einsiedelin (CH); Andreas Pally, Allenwinden (CH)

(73) Assignee: Siemens Schweiz AG, Zurich (CH)

( * ) Notice: Subject to any disclaimer, the term of this patent is extended or adjusted under 35 U.S.C. 154(b) by 242 days.

(21) Appl. No.: 14/440,482

(22) PCT Filed: Oct. 24, 2013

(86) PCT No.: PCT/EP2013/072249
§ 371 (c)(1),
(2) Date: May 4, 2015

(87) PCT Pub. No.: WO2014/067842
PCT Pub. Date: May 8, 2014

(65) Prior Publication Data
US 2015/0303766 A1    Oct. 22, 2015

(30) Foreign Application Priority Data

Nov. 2, 2012   (EP) ..................................... 12191096
Dec. 17, 2012   (EP) ..................................... 12197442

(51) Int. Cl.
*H02K 11/00*   (2016.01)
*H02K 7/10*    (2006.01)
(Continued)

(52) U.S. Cl.
CPC ............. *H02K 5/22* (2013.01); *H05K 5/0247* (2013.01); *H05K 5/069* (2013.01)

(58) Field of Classification Search
CPC ................................ H02K 11/21; H02K 5/02
(Continued)

(56) References Cited

U.S. PATENT DOCUMENTS 6,317,332 B1   11/2001   Weber et al.
6,568,551 B2    5/2003   Grossenbacher et al.
(Continued)

FOREIGN PATENT DOCUMENTS

DE         2434892 A1    2/1976
DE        19851455 A1    8/1999
(Continued)

*Primary Examiner* — Jose Gonzalez Quinones
(74) *Attorney, Agent, or Firm* — Laurence Greenberg; Werner Stemer; Ralph Locher

(57) ABSTRACT

An actuating drive contains a housing which has a first housing part and a second housing part. The two housing parts each have an edge, each edge having an end face, and the two end faces face each other when the two housing parts are joined. The first housing part and the second housing part can be detachably joined. The actuating drive is configured to accommodate an exchangeable connection module for a cable feed. The exchangeable connection module can be inserted into an opening of the first edge of the first housing part and the exchangeable connection module can be connected in a form-closed manner to the end faces of the edges in a region of the opening when the two housing parts are joined. Thus, an actuating drive, in particular for ventilation flaps or fire dampers, having high flexibility in the electrical connection contacting is provided.

13 Claims, 11 Drawing Sheets

(51) Int. Cl.
*H02K 5/22* (2006.01)
*H05K 5/02* (2006.01)
*H05K 5/06* (2006.01)

(58) Field of Classification Search
USPC ............. 310/40 MM, 71, 75 R, 80, 83, 98
See application file for complete search history.

(56) References Cited

U.S. PATENT DOCUMENTS

| | | | |
|---|---|---|---|
| 7,230,362 B2* | 6/2007 | Benkert | H02K 5/148 310/239 |
| 7,722,405 B2 | 5/2010 | Jaklin et al. | |
| 2002/0084272 A1* | 7/2002 | Grossenbacher | H05K 5/063 220/4.21 |
| 2008/0081517 A1* | 4/2008 | Jaklin | H05K 5/0247 439/638 |
| 2009/0072602 A1 | 3/2009 | Schuler | |
| 2010/0127602 A1* | 5/2010 | Rueggen | H02K 11/33 310/68 D |
| 2012/0194017 A1* | 8/2012 | Xiong | H02K 11/28 310/71 |

FOREIGN PATENT DOCUMENTS

| | | |
|---|---|---|
| DE | 102004060694 A1 | 6/2006 |
| EP | 1215950 A1 | 6/2002 |
| EP | 1528656 A1 | 5/2005 |
| RU | 2417907 C2 | 5/2011 |

* cited by examiner

ACTUATING DRIVE HAVING AN ELECTRICAL PLUG-IN CONNECTION

BACKGROUND OF THE INVENTION

Field of the Invention

The invention relates to an actuating drive of the type mentioned in the preamble of the main actuating drive claim. The invention also relates to a connection module for a cable feed to an actuating drive of this kind. The invention also relates to an arrangement for the drive of actuators, comprising an actuating drive and a connection module for a cable feed to the actuating drive.

Actuating drives of this kind are advantageously used in heating, ventilation and air conditioning technology to operate actuators, such as ventilation flaps, valves and the like. A housing for an actuating drive of this kind must in particular protect electromechanical and electronic components of the actuating drive from contamination and spray. An actuating drive is described for example in the German patent application DE19516973A1.

An actuating drive with housing and seal is known for example from the European patent application EP1215950A1.

The electronic components of the actuator are conventionally supplied with power via electrical cable connections. The electrical connection can be made for example by way of luster terminals. German patent specification DE19627988C1 discloses an electrical plug-in connection for the drive of moving mechanisms such as doors, gates, blinds, awnings, etc., which is intended to ensure safe operability from an electrical perspective. The solution disclosed in DE19627988C1 is only suitable for certain types of cable connection, however.

BRIEF SUMMARY OF THE INVENTION

It is therefore the object of the present invention to provide an actuating drive for the operation of actuators, such as ventilation flaps, valves and the like, whose electrical power can be supplied by way of different types of cable connection.

The object is achieved by an actuating drive, comprising a housing, which has a first housing part and a second housing part, wherein the two housing parts each have an edge, each edge having an end face, and wherein the two end faces face each other when the two housing parts are joined, wherein the first housing part and the second housing part can be detachably joined, characterized in that the actuating drive is designed to accommodate an exchangeable connection module for a cable feed, wherein the exchangeable connection module can be inserted into an opening of the first edge of the first housing part and wherein the exchangeable connection module can be connected in a form-closed manner to the end faces of the edges in a region of the opening when the two housing parts are joined. The actuating drive is very versatile; it can be used for example for ventilation applications or for fire dampers. The connection module for the electrical power supply can have different designs and be assembled on the actuating drive by the customer or in the factory. It is therefore possible to easily connect the power supply afterwards to an actuator pre-assembled at the operation site. The housing can be manufactured for example from plastics material or by light metal casting (for example aluminum). The actuating drive can be used with spring return (safety function, for example emergency function for a flap) or without spring return. The actuating drive can therefore be assembled in any position.

A first advantageous embodiment of the invention lies in that a groove-bead connection is used for insertion of the connection module, wherein the end faces of the edges form a peripheral bead in the region of the opening and wherein, for insertion into the opening, the connection module has a peripheral groove for accommodating the bead in a form-closed manner, wherein the groove is formed by a first rib and a second rib, wherein, after insertion of the connection module and joining of the two housing parts, the first rib borders a housing interior and the second rib rests on the housing to the outside. The groove-bead connection enables simple plug-in assembly of the connection module in the actuating drive. The form fit produces effective protection against spray and contamination in the interior of the actuating drive, i.e. inside the housing. A sealing element (for example a rubber seal) could optionally be provided over the entire end face or in the region of the groove-bead connection to obtain for example an airtight seal of the interior of the housing. Groove-bead connections can be easily produced, for example by mold casting. The existing end faces of the edges in the region of the opening are preferably used as a peripheral bead. The bead does not have to be provided on the housing in an extra operation therefore.

The groove-bead principle (i.e. the sealing geometry of a groove-bead connection) produces high mechanical strength between connection module and actuating drive over a large effective area. This is for example an important prerequisite for the necessary mechanical loading capacity in flexible cables, but in particular with rigid installation pipe connections (for example in the case of what are known as rigid conduit screw connections).

Groove-bead connections enable inter alia a connection in a form-closed manner to be established quickly (by plugging or insertion), and groove-bead connections also enable robust embodiments of the actuating drive.

A further advantageous embodiment of the invention lies in that the second rib is formed by a body of the connection module. Part of the geometry or the spatial design of the connection module can therefore be used as the second rib. This facilitates production of the housing and the connection module.

A further advantageous embodiment of the invention lies in that the actuating drive is designed to accommodate a plurality of connection modules. Connection modules serve to supply the connections for communication (for example electrical actuating signal for an actuator (for example ventilation flaps)) and/or to supply power to the electrical components (for example motor) in the actuating drive. The possibility of providing the actuating drive with a plurality of connection modules means that the actuating drive can be scaled in design, according to environmental or customer requirements. For example an optional second connection module, by way of example for an auxiliary switch, a feedback potentiometer, a position sensor or a limit switch, may therefore be provided or alternatively or additionally a connection module for feeding a sensor (for example a 24 volt output for feeding a fire prevention and/or temperature sensor. Sensors of this kind are conventionally present in buildings to detect risk parameters and can therefore be easily electrically connected without separate cabling. Since the mains voltage for the auxiliary switch is not supplied via a printed circuit board, it is possible inter alia to construct the housing as an aluminum housing.

When they are not being used the openings for the optional connection modules can be terminated in a form-closed manner (for example groove-bead principle) by closure elements provided for this purpose (what are known as dummies).

A further advantageous embodiment of the invention lies in that the second housing part also has an opening of the second edge for jointly accommodating the connection modules together with the opening of the first edge. The size of the connection module is consequently not limited by the height of the first edge.

A further advantageous embodiment of the invention lies in that a cable permanently installed in the actuating drive is fed through the connection module. Actuating drives having permanently installed cables fed through the connection module have low production costs. The connection modules acts like a terminal block or connection block in the housing. One or more cable(s) can be fed to the actuating drive through holes in the connection module, it being possible to achieve the tension relief for the cables in the connection module. The connection module is advantageously made from a plastics material (for example a rubber compound) which is connected to the housing in a form-closed manner after assembly of the connection module. If required, the cable is connected in a form-closed manner to the connection module, for example by a clamp connection.

A further advantageous embodiment of the invention lies in that the connection module is configured as an insertable terminal with a series of connecting contacts for connecting electrical components in the housing. The connection module takes on a simple terminal function here, for example as a permanently inserted terminal with protective cover.

A further advantageous embodiment of the invention lies in that the connecting contacts are coupled by what is known as a daisy chain connection. Daisy chain connections are simple and inexpensive to produce and are suitable for what are known as "low cast" markets in particular.

A further advantageous embodiment of the invention lies in that the connection module is designed as an insertable screw terminal, in particular for protection category IP 54. The connection module assumes a terminal function in this case, for example as a permanently inserted screw terminal with protective cover. The screw terminal can be for example a metric, PG cable gland or a conduit screw connection.

A further advantageous embodiment of the invention lies in that the connection module is designed in two parts, wherein the first part can be inserted into the housing in a form-closed manner in the region of the opening and on the housing outer part has a socket for a plug-in connection, and wherein the second part is designed as a pluggable screw terminal having a mating connector complementary with the socket. The pluggable screw terminal can be wired at a suitable location independently of the mechanically pre-assembled actuating drive. Actuating drives are often mechanically pre-assembled at locations that are difficult to access, such as suspended ceilings, and are only electrically wired later. Good accessibility to the screw terminal is also ensured, in particular with reversible spring return actuating drives in both possible assembly positions. Simplified two-handed assembly (wire/screwdriver) is therefore possible with a correspondingly mechanically pre-assembled actuating drive. The actuating drive can also be replaced without prior electrical switching-off. Various warning messages in the assembly instructions or on the housing may therefore be omitted.

A further advantageous embodiment of the invention lies in that the connection module is designed in two parts, wherein the first part can be inserted into the housing in a form-closed manner in the region of the opening and on the housing outer part has a socket for a plug-in connection, and wherein the second part is designed as a pluggable terminal having a mating connector complementary with the socket, wherein the terminal is injected on to a fed cable by way of an electrically insulated plastics material. The actuating drive can also be replaced thereby without prior electrical switching-off. Various warning messages in the assembly instructions or on the housing may therefore be omitted in this embodiment as well.

A further advantageous embodiment of the invention lies in that the actuating drive comprises a circuit carrier (for example circuit board, printed circuit board) having contact elements, wherein the contact elements are designed with contact elements of the connection module that are complementary therewith for enabling electrical contacting on insertion of the connection module. A step for electrical contacting is saved in this way. Electrical contacting occurs automatically by insertion of the connection module through the contacting of the contact elements. Insertion and contacting therefore occur in a joint operation.

A further advantageous embodiment of the invention lies in that a groove-bead connection is used for insertion of the connection module, wherein the end faces of the edges form a peripheral groove in the region of the opening and wherein, for insertion into the opening, the connection module has a peripheral bead for insertion in a form-closed manner into the groove, wherein the groove is formed by a first rib and a second rib, wherein the first rib rests on a housing interior and the second rib on a housing exterior. To produce a groove-bead connection for connection in a form-closed manner of connection module and housing, the groove and bead can therefore either be formed by the geometry of the connection module or by the geometry of the housing.

The groove-bead principle (i.e. the sealing geometry of a groove-bead connection) produces high mechanical strength between connection module and actuating drive over a large effective area. This is for example an important prerequisite for the necessary mechanical loading capacity in flexible cables but in particular with rigid conduit screw connections. Groove-bead connections enable inter alia a connection in a form-closed manner to be established quickly (by plugging or insertion) and groove-bead connections also enable robust embodiments of the actuating drive.

The object is also achieved by a connection module for a cable feed to an actuating drive, wherein the connection module can be inserted into an opening in an edge of a housing part and wherein the connection module can be connected in a form-closed manner to the end faces of the edges in a region of the opening when the two housing parts are joined. The use of inventive connection modules of this kind enables flexible electrical contacting for actuating drives.

The object is also achieved by an arrangement for the drive of actuating drives, the arrangement comprising: an actuating drive, comprising a housing, which has a first housing part and a second housing part, wherein the two housing parts each have an edge, each edge having an end face, and wherein the two end faces face each other when the two housing parts are joined, wherein the first housing part and the second housing part can be detachably joined, and a connection module for a cable feed to the actuating drive, wherein the connection module is inserted into an opening of the first edge of the first housing part and wherein the exchangeable connection module is connected in a form-closed manner to the end faces of the edges in a region of the opening by joining of the two housing parts. The inventive arrangement enables the use of different connection modules for electrical contacting of the actuating drive. Flexible and exchangeable electrical contacting for actuating drives is therefore possible.

A further advantageous embodiment of the invention for an arrangement for the drive of actuators lies in that the connection module for the cable feed to the actuating drive can be inserted into an opening in the edge of a housing part and wherein the connection module can be connected in a form-closed manner to the end faces of the edges in a region of the opening when the two housing parts are joined. Inventive connection modules of this kind enable simple and flexible electrical connection (different types of connection are possible) for actuating drives, in particular for the drive of actuators.

BRIEF DESCRIPTION OF THE SEVERAL VIEWS OF THE DRAWING

The invention and advantageous embodiments of the present invention will be explained using the figures below as examples, in which.

DESCRIPTION OF THE INVENTION

Figure 1:
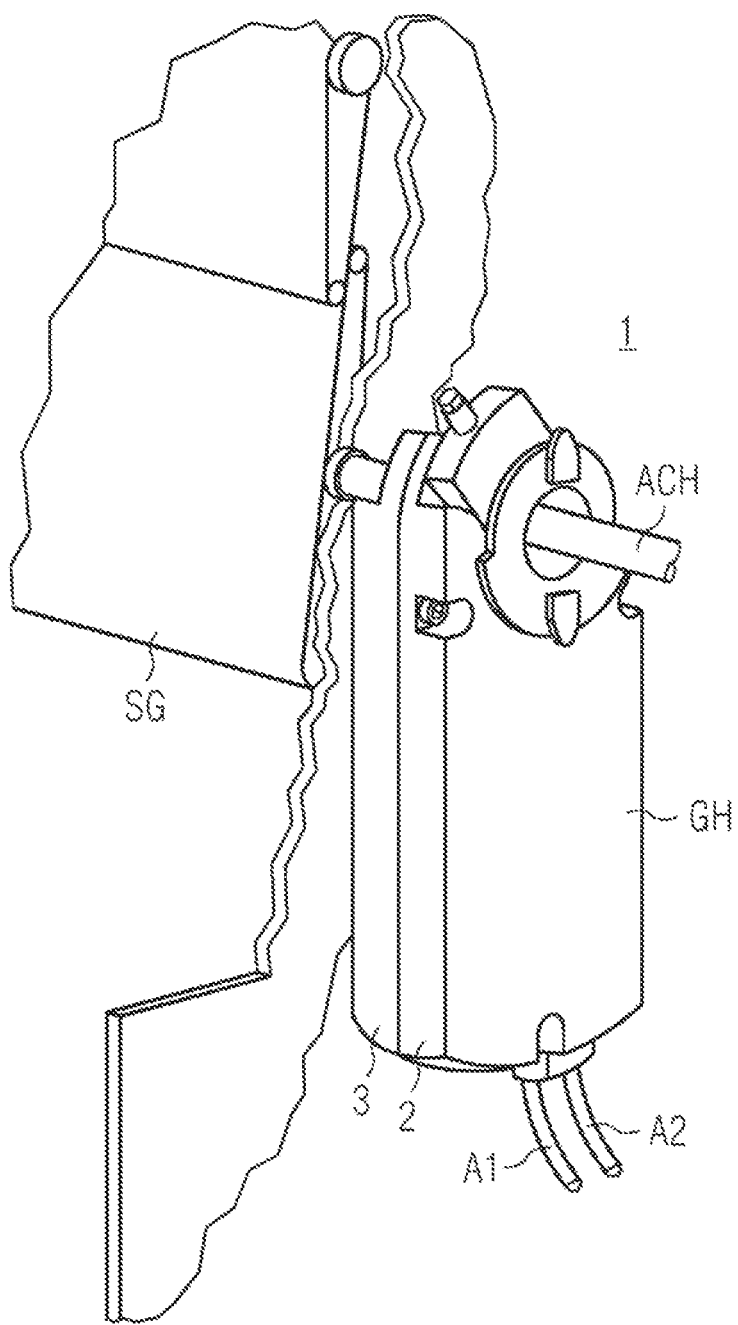
FIG. 1 shows an exemplary actuating drive having a housing.

In FIG. 1, reference numeral 1 denotes an exemplary actuating drive for operating an actuator SG. The actuator SG—a ventilation flap in the example—can be operated by way of a rotatable axle ACH. The actuating drive 1 has a housing GH comprising a first housing part 2 and a second housing part 3. The two housing parts 2 and 3 are advantageously detachably connected to each other by screws. The actuating drive 1 has a feed for connections A1 and A2. The connections A1 and A2 serve for communication and/or supply. The connections A1 and A2 are typically for an electrical actuating signal. If required, the feed has further connections—by way of example for position feedback or for power supply. The geometry and functionality of the housing GH are advantageously geared on the one hand to electronic, electrical and mechanical components and modules of the actuating drive 1 that are to be protected, and on the other hand to the arrangement of the actuating drive 1 on the actuator SG, with inter alia an inexpensive but safe and functional assembly being desired.

Figure 2:
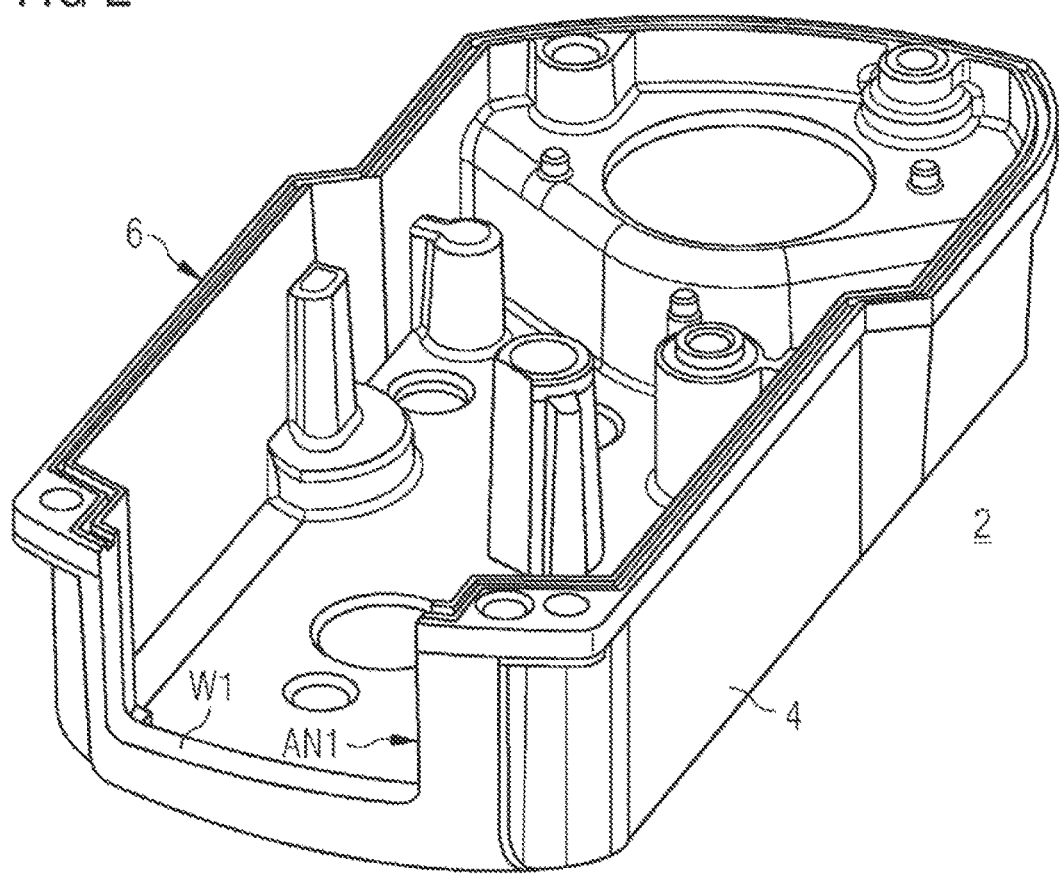
FIG. 2 shows a first exemplary housing part having an edge.

FIG. 2 shows by way of example a design of the first housing part 2 constructed basically as a shell. The first housing part 2 has a drawn-up edge 4 with an end face 6 by which the first housing part 2 is substantially delimited. The drawn-up edge 4 advantageously has an opening AN1 for feeding cabling. The end face 6 of the housing part 1 is advantageously designed, in particular in the region of the opening AN1, as a bead W1 which can be introduced into a groove.

The first housing part 2 advantageously has holes for screws in order to detachably connect the first housing part 2 to the second housing part 3.

Figure 3:
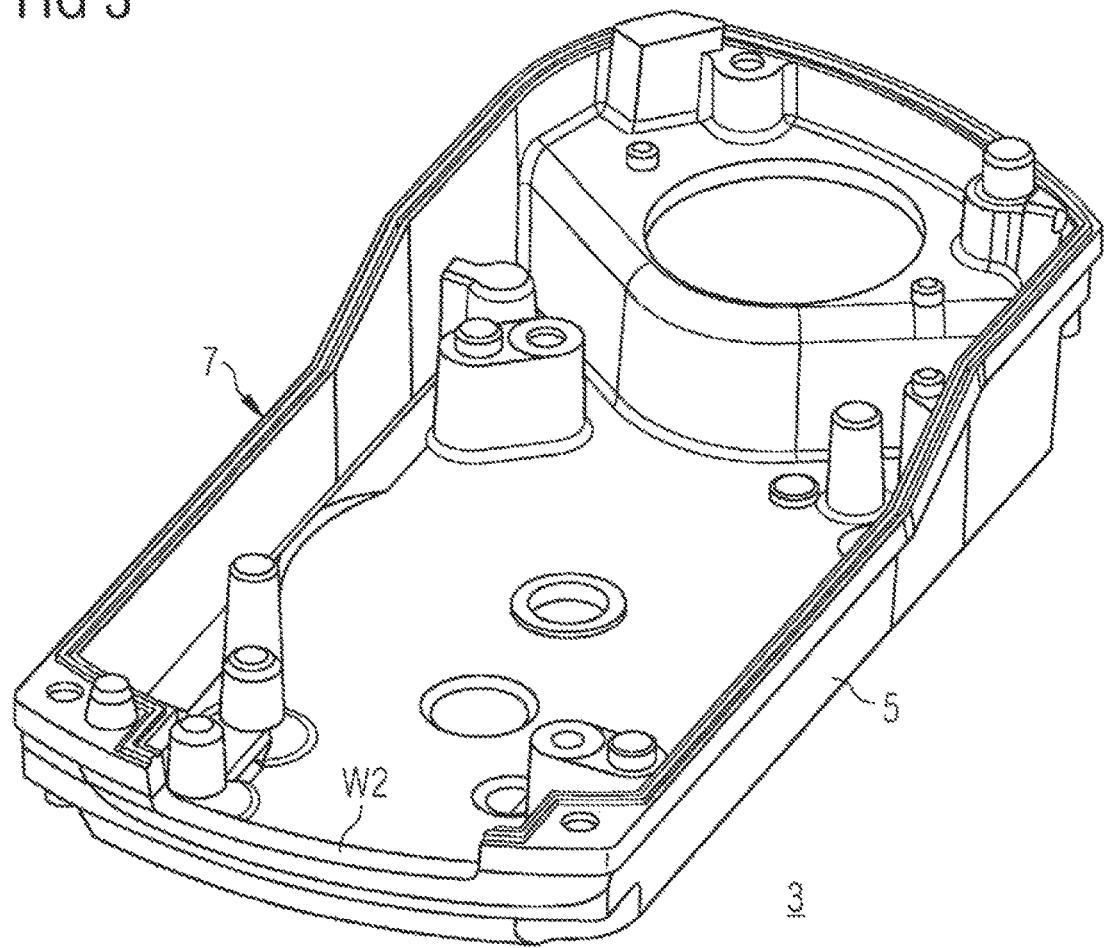
FIG. 3 shows a second exemplary housing part having an edge.

FIG. 3 shows by way of example a design of the second housing part 3 constructed basically as a cover. The second housing part 3 has a drawn-up edge 5 with an end face 7 by which the second housing part 3 is substantially delimited. The drawn-up edge 5 optionally also has an opening for a supply. The second housing part 3 can, however, also be constructed without an opening for a supply. In the region of an optional opening the end face 7 of the housing part 3 is also advantageously constructed as a bead W2 as a counterpart to a groove. If the second housing part 3 does not have an opening the region of the end face 7 of the second housing part 3, which, when assembled, faces the opening AN1 of the first housing part 2, is advantageously constructed as a bead W2. The second housing part 3 also advantageously has holes for a screw connection to the first housing part 2.

The housing GH has a seal if the two housing parts 2 and 3 are joined in such a way that the two end faces 6 and 7 face each other, it being possible for the first housing part 2 and the second housing part 3 to be detachable and to be placed directly on top of each other and screwed together. This can occur with or without an additional sealing element (for example rubber, paste). This then creates protection from spray or contamination.

So that a good fit is achieved between the two housing parts 2 and 3 and a reciprocal displacement along the edge 4 or 5 is prevented, the shapes of the two end faces 6 and 7 should be coordinated with each other such that a reciprocal stop is formed. The two housing parts 2 and 3 are advantageously connected to each other by a plurality of screws. In principle, however, a plug-in or snap connection is also possible. The housing GH is advantageously produced by casting a light metal alloy, by way of example by die casting an aluminum alloy. The housing GH can, however, also be produced from plastics material. The housing GH can be produced for example in an injection molding process from an electrically insulating plastics material, for example from ABS.

Figure 4:
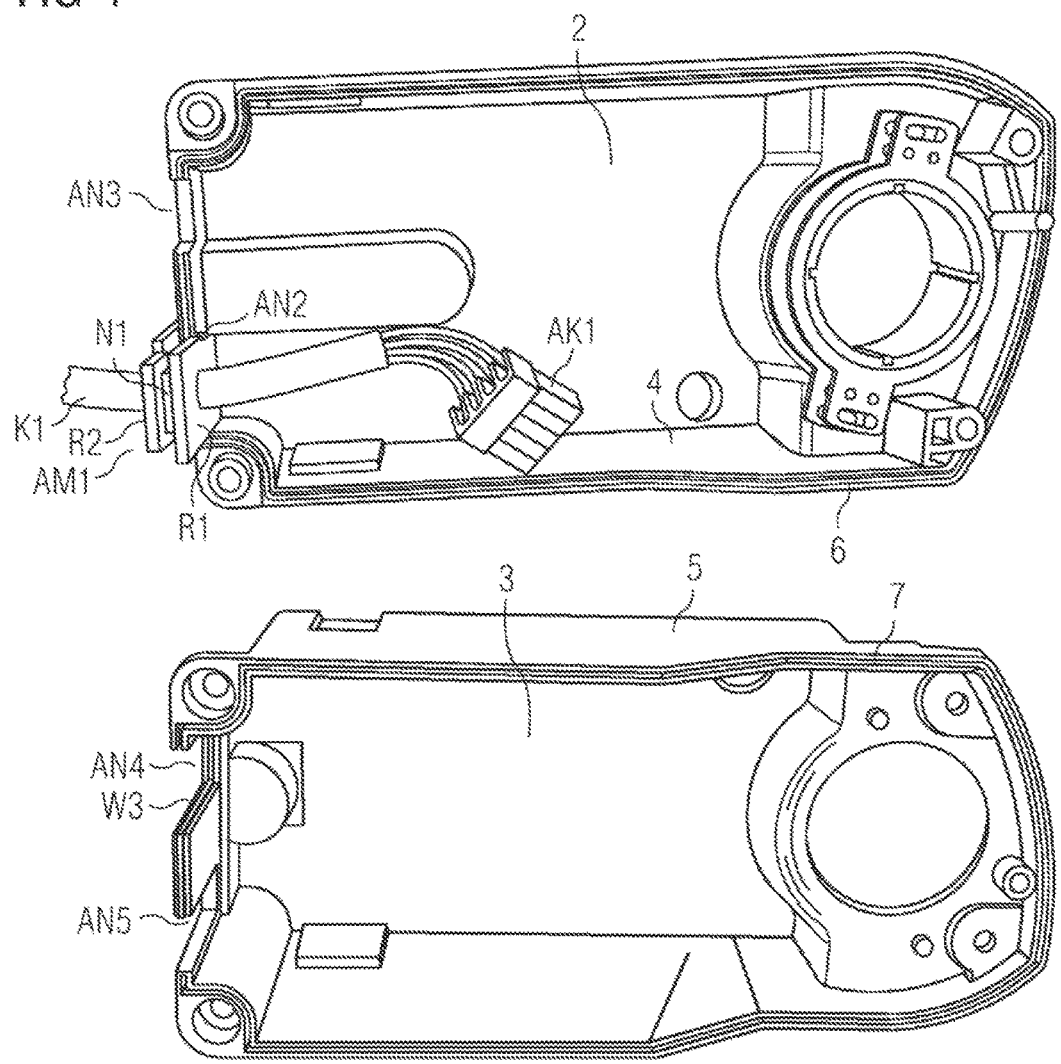
FIG. 4 shows exemplary housing parts having a first exemplary connection module, FIG. 5, FIG. 6 each show exemplary housing parts having a second exemplary connection module, FIG. 7, FIG. 8 each show exemplary housing parts having a third exemplary connection module, FIG. 9-FIG. 11 each show exemplary housing parts having a fourth exemplary connection module.

FIG. 4 shows housing parts 2, 3 with a first exemplary connection module AM1. In FIG. 4 the housing parts 2, 3 are shown individually (i.e. opened or open) and not assembled to form a housing. To achieve an assembled housing the housing parts 2, 3 must be connected together in a form-closed manner at the end faces 6, 7 so as to abut each other. At their corners the housing parts 2, 3 each have openings (holes) for screw connections. In the illustration according to FIG. 4 the housing parts 2, 3 have a round opening on the right-hand side respectively for accommodating the axle for operating an actuator (for example a ventilation flap or fire damper).

In the illustration according to FIG. 4 the housing part 2 has two openings AN2, AN3 and the housing part 3 the associated openings AN4 and AN5. When the housing parts 2, 3 are assembled the openings AN2 and AN4 and the openings AN3 and AN5 each form a feed opening for the connection module AM1. A second or third feed opening for further connection modules AM1 is optional. It is not necessary for each housing part 2, 3 to include openings AN2-AN5. A housing part 2, 3 can be designed for example only as a cover, i.e. without openings AN2-AN5.

In the illustration according to FIG. 4 a cable K1 permanently installed in the actuating drive is fed by way of example through the connection module AM1. Communication and/or a power supply for the electrical components (for example electric motor), which are located inside the housing actuating drive, occurs through the cable K1. The electrical components are supplied by the connection contacting AK1.

FIG. 4 shows a first housing part 2 and a second housing part 3 for an actuating drive, wherein the two housing parts 2, 3 each have an edge 4,5, each edge having an end face 6, 7 and wherein the two end faces 6,7 face each other when the two housing parts 2, 3 are joined, it being possible to detachably join the first housing part 2 and the second housing part 3 directly or with a sealing element (for example by way of a screw connection), wherein the housing of the actuating drive is designed to accommodate an exchangeable connection module AM1 for a cable feed K1, wherein the exchangeable connection module AM1 can be inserted into an opening AN2 or AN3 of the first edge 4 of the first housing part 2 and wherein the exchangeable connection module AM1 can be connected to the end faces 6, 7 of the edges 4 and 5 of the housing parts in a region of the opening AN2 or AN3 in a form-closed manner when the two housing parts 2 and 3 are assembled. The dimensions of the openings AN2-AN5 and the connection module AM1 to be accommodated are geometrically coordinated with each other in such a way that, after insertion into the opening AN2-AN5, the connection module AM1 ends flush, i.e. in a form-closed manner with the respective end faces 6, 7 in the region of the opening AN2-AN5.

A groove-bead connection is advantageously used for insertion of the connection module AM1, with the end faces 6, 7 of the edges 4, 5 of the housing parts 2, 3 forming one peripheral bead W3 respectively in the region of the opening AN2-AN5 and, for insertion into the opening AN2-AN5, the connection module AM1 having a peripheral groove N1 for accommodating the bead W3 in a form-closed manner, with the groove N1 being formed by a first rib R1 and a second rib R2, with the first rib R1 adjoining a housing interior and the second rib R2 resting on the housing to the outside after insertion of the connection module AM1 and joining of the two housing parts 2, 3.

The bead W3 and the groove N1 can have additional sealing elements to ensure that dirt and spray cannot pass into the housing. It is therefore possible for example for the bead W3 and the groove N1 to in turn themselves have mutually complementary elements for a groove-bead connection in order to increase the tightness. A further groove-bead connection of this kind advantageously establishes a connection in a form-closed manner.

A groove-bead connection can be accomplished by additionally attached elements on the housing parts 2, 3 and/or on the connection module AM1. An existing geometry of the housing parts 2, 3 and/or the connection module AM1 is advantageously used for a groove-bead connection, however.

In the illustration according to FIG. 4 the second rib R2 is formed by a geometrically appropriate part of the connection module AM1.

Actuating drives with permanently installed cables K1 fed through the connection module AM1 have low production costs. The connection module AM1 acts like a clamping block or connection block in the housing. One or more cable(s) K1 can be fed through holes in the connection module to the actuating drive. These holes accommodate the cable K1 in a form-closed manner so that no contamination passes into the housing interior. The connection module AM1 is advantageously made from a plastics material (for example a rubber join) which is connected in a form-closed manner to the housing and the cables after assembly of the connection module AM1. The electrical connecting contact can occur for example by way of an AMP plug. The cable K1 advantageously has at least three wires.

Figure 5:
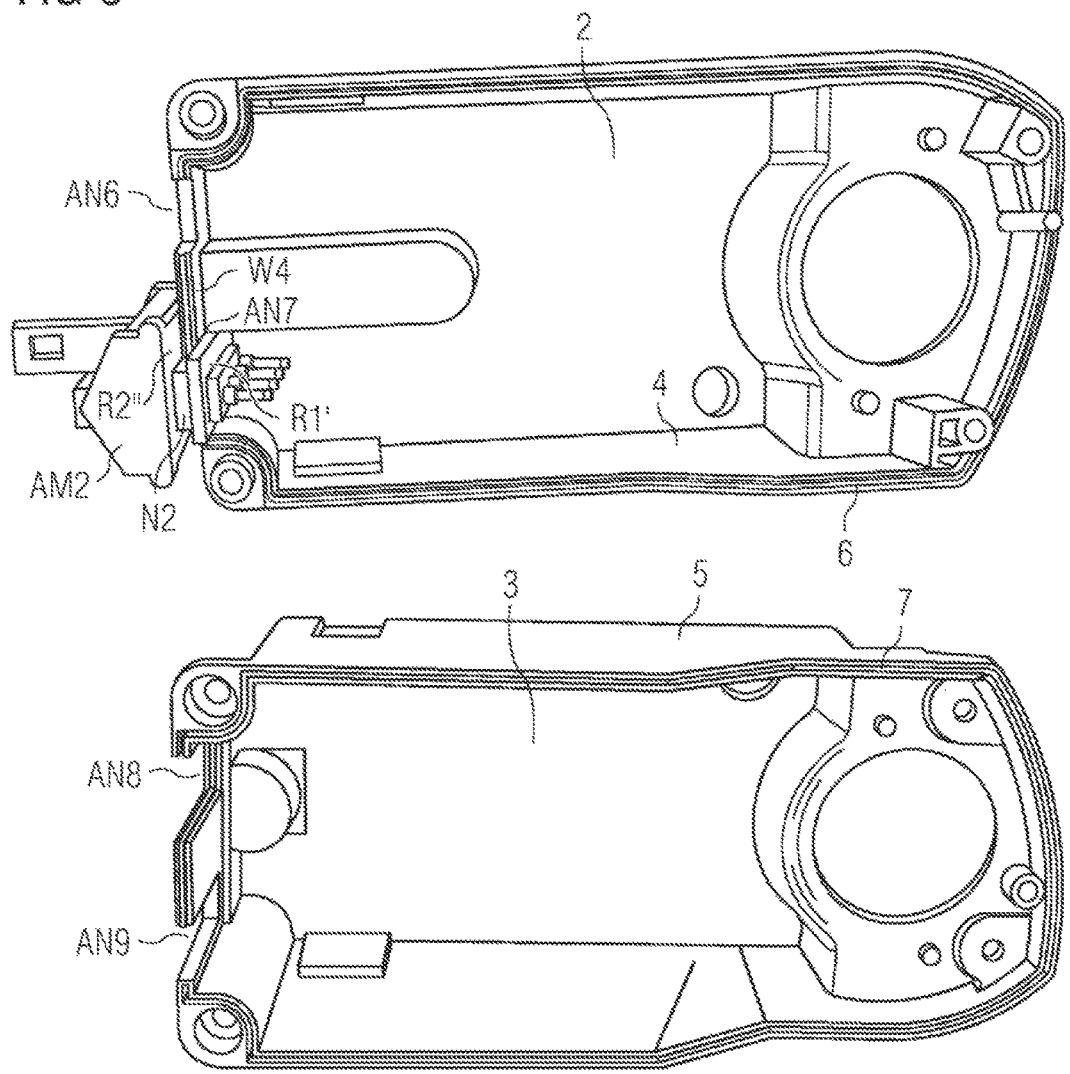
Figure 6:
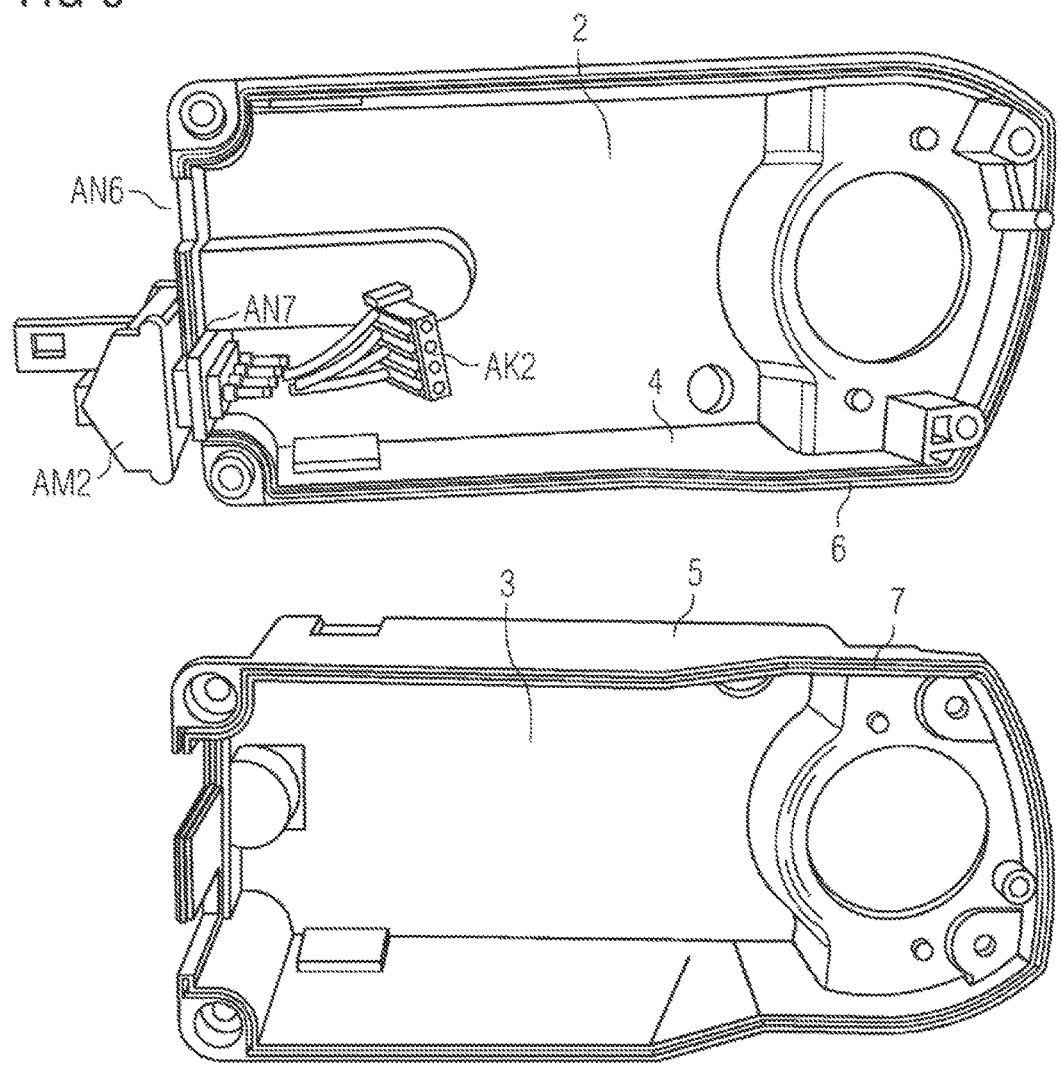

FIG. 5 and FIG. 6 each show housing parts 2, 3 with a second exemplary connection module AM2, AM2'.

FIG. 5 shows housing parts 2, 3 with a second exemplary connection module AM2. In FIG. 5 the housing parts 2, 3 are shown individually (i.e. opened or open) and not assembled to form a housing. To achieve an assembled housing the housing parts 2 and 3 (as already described in FIG. 4) must be connected together in a form-closed manner at the end faces 6, 7 so as to abut each other. At their corners the housing parts 2, 3 each have openings (holes) for screw connections. In the illustration according to FIG. 5 the housing parts 2, 3 have a round opening on the right-hand side respectively for accommodating the axle for operating an actuator (for example a ventilation flap or fire damper).

In the illustration according to FIG. 5 the housing part 2 has two openings AN6, AN7 and the housing part 3 has the associated openings AN8 and AN9. When the housing parts 2, 3 are assembled the openings AN6 and AN9, and the openings AN7 and AN8 respectively form a feed opening for the connection module AM2. A second or third feed opening for further connection modules AM2 is optional. Different types of connection module may also be used in one actuator. It is not necessary for each of the housing parts 2, 3 to include openings AN6-AN9. One of the two housing parts 2, 3 can be designed for example only as a cover, i.e. without openings AN6-AN9. The cover is advantageously designed in such a way that a form-closed and tight join is ensured with the connection module.

In the illustration according to FIG. 5 the connection module AM2 is configured by way of example as an insertable terminal with a series of connecting contacts for the connection of electrical components in the housing. The connection module AM2 takes on a simple terminal function in the process, for example as a permanently inserted terminal with protective flap. The connecting contacts of the connection module AM2 are advantageously coupled by a daisy chain connection. Daisy chain connections are simple and inexpensive to produce and are suitable in particular for what are known as "low cost" markets.

FIG. 6 also shows an exemplary connection module AM2' designed as an insertable terminal with a series of connecting contacts for connection of electrical components in an actuating drive. In the illustration according to FIG. 6 the exemplary connection module AM2' is fitted with an exemplary electrical connecting contact AK2.

Figure 7:
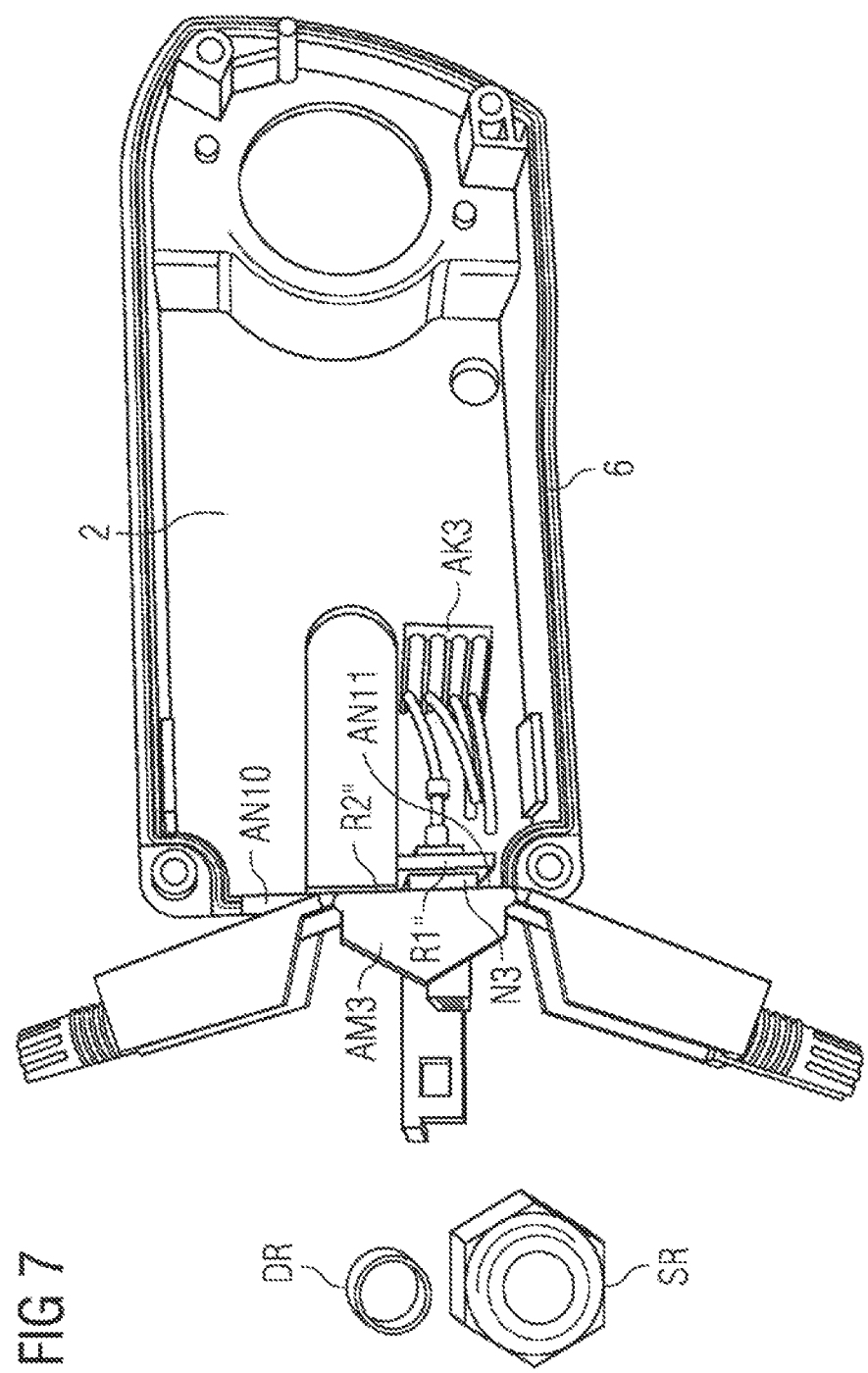
Figure 8:
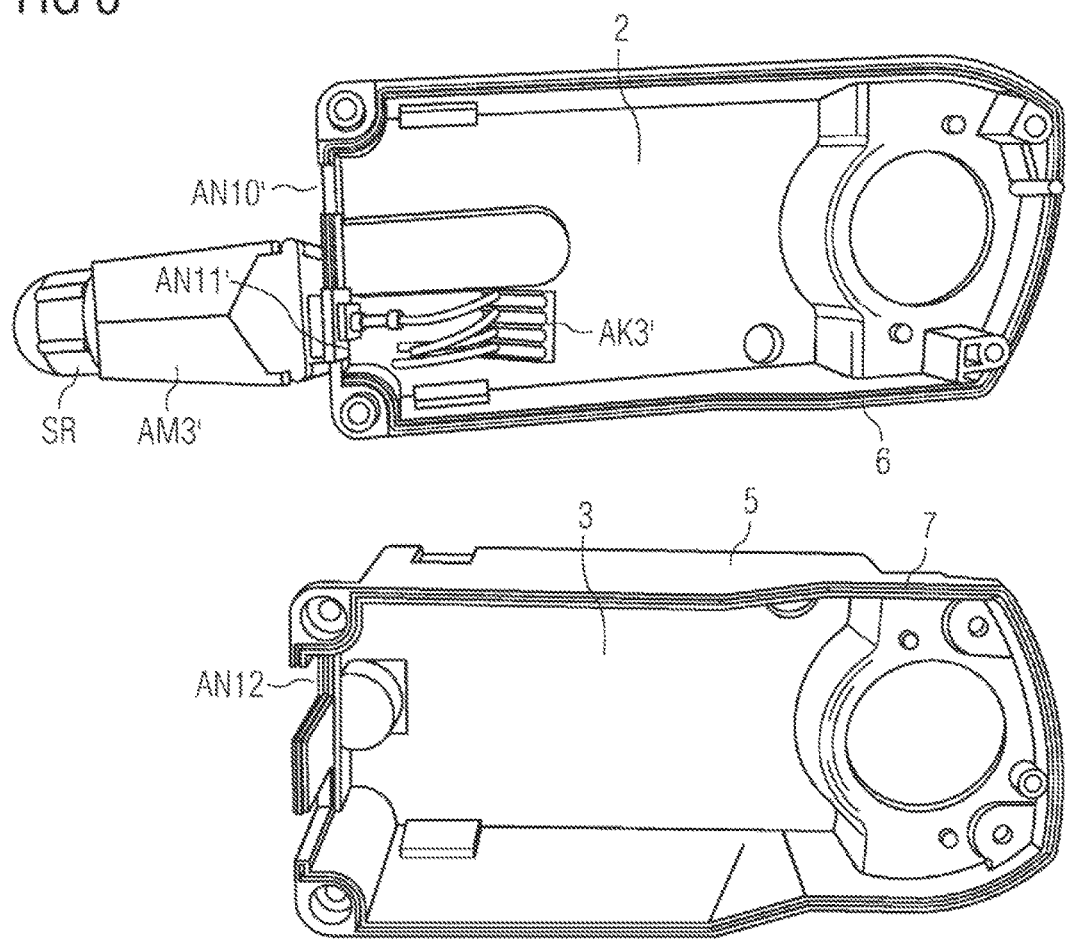

FIG. 7 and FIG. 8 each show housing parts 2, 3 with a third exemplary connection module AM3 and AM3' respectively.

FIG. 7 shows housing part 2 with a third exemplary connection module AM3. In FIG. 7 and FIG. 8 the housing parts 2, 3 are shown individually (i.e. opened or open) and not assembled to form a housing. To achieve an assembled housing the housing parts 2 and 3 (as already described in FIGS. 4 and 5) must be connected together in a form-closed manner at the end faces 6, 7 so as to abut each other. At their corners the housing parts 2, 3 each have openings (holes) for screw connections. In FIG. 7 the housing parts 2, 3 each have a round opening on the right-hand side for accommodating the axle for operating an actuator (for example a ventilation flap or fire damper).

In the illustration according to FIG. 7 the housing part 2 has two openings AN10, AN11 each for feeding a connection module. In FIG. 7 the connection module AM3 is designed by way of example as an insertable screw terminal, in particular for the protection category IP 54. The connection module takes on a terminal function in this connection, for example as a permanently inserted screw terminal with protection flap.

In the illustration according to FIG. 7, an insertable screw terminal with two opened side halves is shown. To secure a cable in the screw terminal AM3 a cable is inserted, connected to the connections of the terminal, the side halves folded together and the two side halves are connected by a screw connection by the screws SR, into which the cable can be threaded. A sealing ring DR is advantageously used in the screw connection to prevent the penetration of dirt into the connection module AM3. Contacting of the electrical components in the actuating drive is made by electrical connecting contacts AK3. Only one housing part 2 can be seen in FIG. 7. The screw terminal can be for example a PG gland or a conduit screw connection.

A groove-bead connection is again advantageously used for insertion of the connection module AM3, with the end faces of the edges of the housing parts each forming a peripheral bead in the region of the opening AN10, AN11 and, for insertion into the opening AN10, AN11, the connection module AM3 having a peripheral groove N3 to accommodate the bead in a form-closed manner, with the groove N3 being formed by a first rib R1" and a second rib R2", wherein, after insertion of the connection module AM3 and joining of the two housing parts, the first rib R1" adjoins a housing interior and the second rib R2" rests on the housing to the outside.

A bead/groove connection can be accomplished by additionally attached elements on the housing parts 2 and/or on the connection module AM3. An existing geometry of a housing part 2 and/or the connection module AM3 is advantageously used, however, for a groove/bead connection. In the illustration according to FIG. 7 the second rib R2" is formed by a geometrically adapted surface of the connection module AM3.

FIG. 8 shows by way of example the connection module AM3', designed as an insertable screw terminal, in the closed state. In other words, in the illustration according to FIG. 8 the two side halves of the screw terminal AM3' are connected in a form-closed manner by a screw SR.

Figure 9:
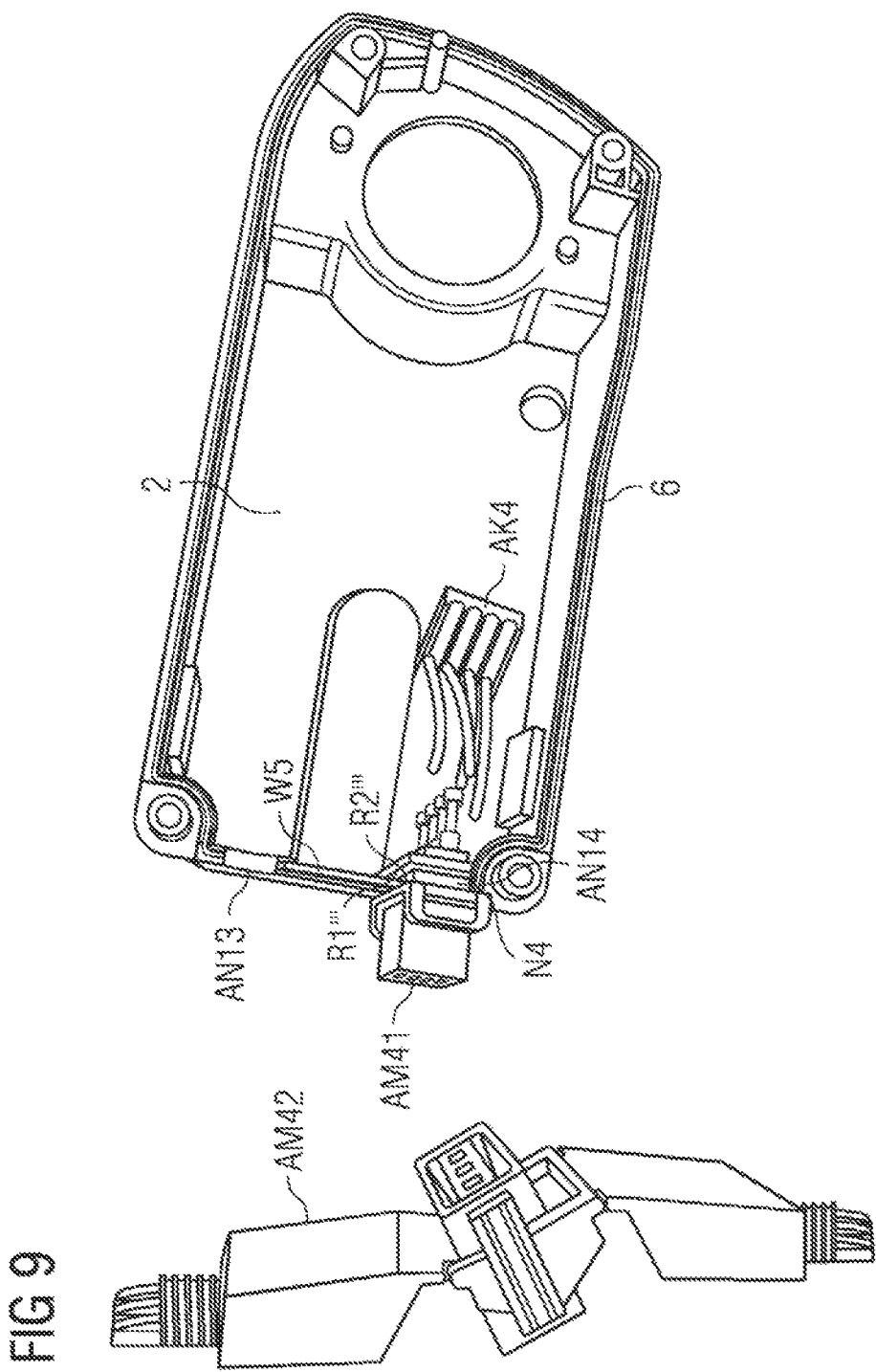
Figure 10:
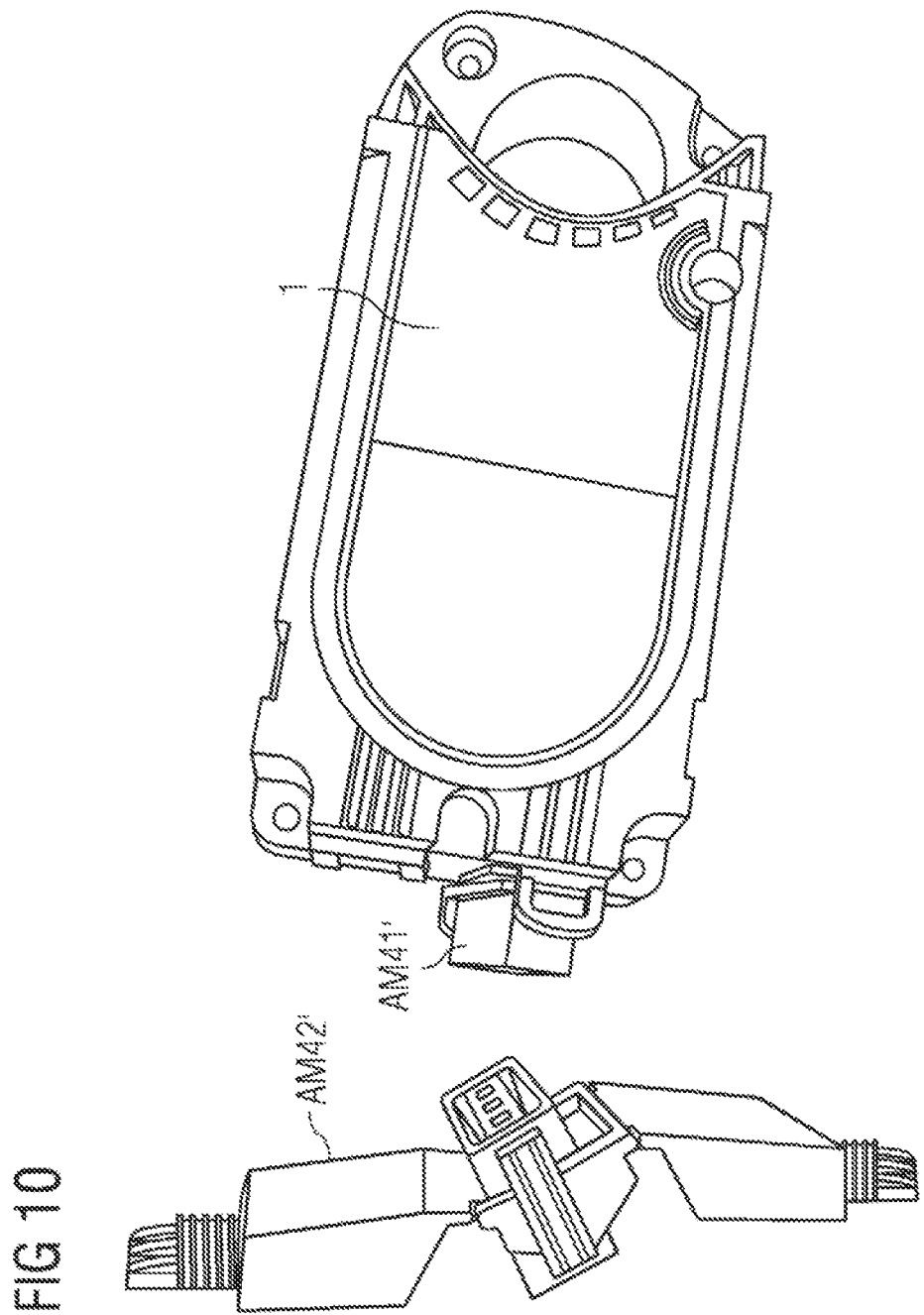
Figure 11:
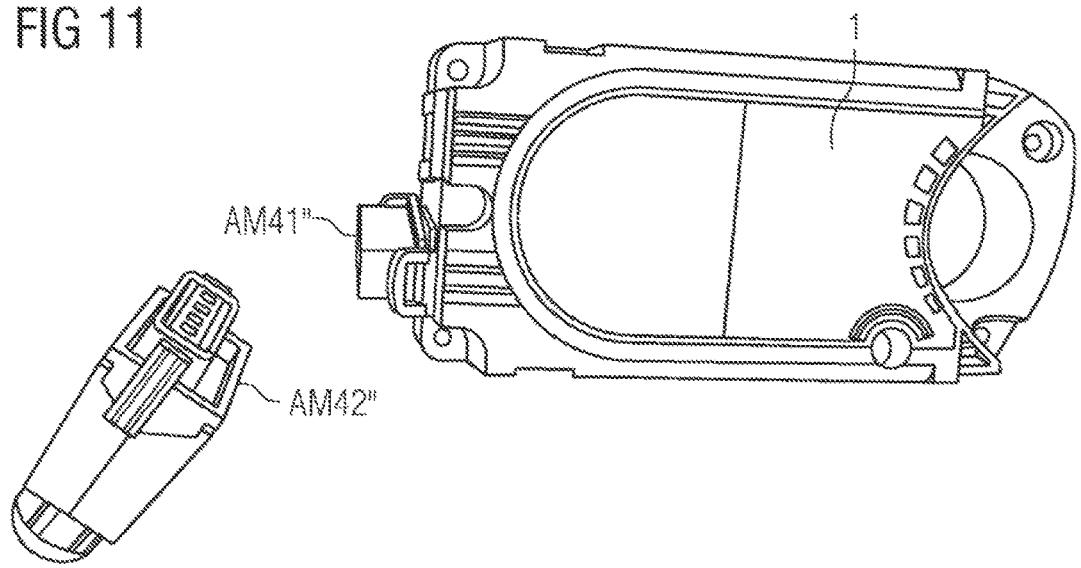

FIGS. 9 to 11 each show housing parts 2 and actuating drives 1 having a fourth exemplary connection module AM41, AM41', AM41", AM42, AM42', AM42", with the connection module being designed in two parts, it being possible to insert the first part AM41, AM41', AM41" into the housing in the region of the opening AN13, AN14 in a form-closed manner, and having a socket for a plug-in connection on the housing outer part, and the second part AM42, AM42', AM42" being designed as a pluggable screw terminal having a mating connection complementary with the socket. The first part AM41, AM41', AM41" of the connection module is advantageously connected in a form-closed manner by a groove-bead connection to the housing of the actuating drive 1.

The illustration in FIG. 9 shows how the first part AM41, AM41', AM41" of the connection module can be inserted by way of a groove-bead connection into the housing part 2.

The end faces of the edges of the housing parts each form a peripheral bead in the region of the opening AN13 or AN14 and for insertion into the opening AN13 or AN14 the first part AM41, AM41', AM41" of the connection module forms a peripheral groove N4 for accommodating the bead in a form-closed manner. In FIG. 9 the groove N4 is formed by a first rib R1''' and a second rib R2''', wherein, after insertion of the first part AM41, AM41', AM41" of the connection module and joining of the two housing parts, the first rib R1''' adjoins a housing interior and the second rib R2''' rests on the housing to the outside.

A groove-bead connection can be accomplished by additionally attached elements on the housing parts 2 and/or on the first part AM41, AM41', AM41" of the connection module. An existing geometry of a housing part 2 and/or the first part AM41, AM41', AM41" of the connection module is advantageously used for a groove-bead connection, however. In the illustration according to FIG. 9 the second rib R2''' is formed by an appropriately designed part of the first part AM41, AM41', AM41" (FIGS. 10, 11) of the connection module.

The connection module according to the illustration in FIG. 9 therefore acts like a mains plug that can be plugged in and unplugged. FIG. 9 shows the second part AM42 of the connection module as a pluggable screw terminal with open side halves.

FIG. 10 shows an actuator 1 with joined housing parts. FIG. 10 also shows the second part AM42' of the connection module as a pluggable screw terminal with open side halves. The mating connection AM41' complementary with the pluggable screw terminal AM42' is introduced into the actuator 1 in a form-closed manner, for example by a groove-bead connection.

FIG. 11 also shows an actuator 1 with joined housing parts. However, FIG. 11 shows the second part AM42" of the connection module as a pluggable screw terminal with closed side halves. The mating connection AM41" complementary with the pluggable screw terminal AM42" is secured in the actuator 1 in a form-closed and fixed manner in the illustration according to FIG. 11 as well.

As shown in FIGS. 9 to 11, the pluggable screw terminal can be wired at a suitable location independently of the mechanically pre-assembled actuating drive. Actuating drives are often mechanically pre-assembled at locations that are difficult to access, such as suspended ceilings, and are only electrically wired later. Good accessibility to the screw terminal is also ensured, in particular with reversible spring return actuating drives in both possible assembly positions. Simplified two-handed assembly (wire/screwdriver) is therefore possible with a correspondingly mechanically pre-assembled actuating drive. The actuating drive can also be replaced without prior electrical switching-off. Various warning messages in the assembly instructions or on the housing may therefore be omitted.

Figure 12:
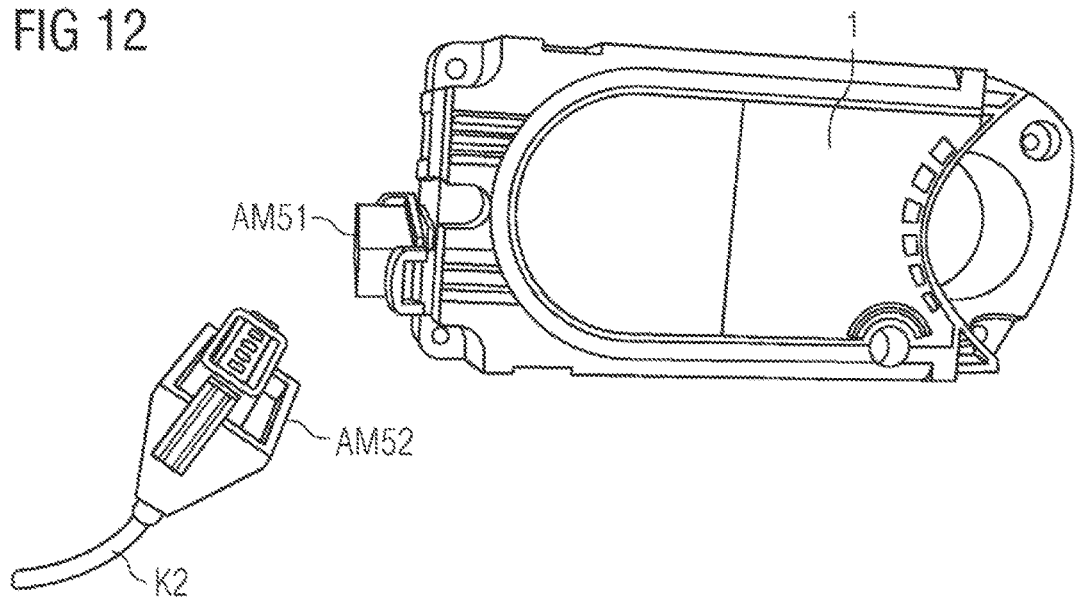
FIG. 12 shows an exemplary actuating drive having a fifth exemplary connection module.

FIG. 12 shows an actuating drive 1 with a fifth, by way of example, two-part, connection module AM51, AM52, wherein the first part AM51 can be inserted into the housing in a form-closed manner in the region of the opening and on the housing outer part has a socket for a plug-in connection, and wherein the second part AM52 is designed as a pluggable terminal having a mating connection complementary with the socket, with the terminal being injected onto a fed cable by way of an electrical insulated plastics material. The fed cable does not have to be secured to the terminal using a clamp connection or screw connection therefore. The pluggable terminal AM52 having the cable K2 to be fed can be produced for example in an injection molding process from an electrically insulating plastics material, for example from ABS. The design according to FIG. 12 also enables the actuating drive to be replaced without prior electrical switching-off. Various warning messages in the assembly instructions or on the housing may therefore be omitted.

A further advantageous embodiment of the invention lies in that the actuating drive has a circuit carrier (for example circuit board, printed circuit board) with contact elements, with the contact elements being designed to enable electrical contacting with complementary contact elements of the connection module on insertion of the connection module. A step for electrical contacting is saved in this way. Electrical contacting occurs automatically by insertion of the connection module by way of the physical contacting of the contact elements. Insertion and contacting occur therefore in a joint operation. This is particularly advantageous in the case of assembly in situ (for example at the construction site).

The inventive actuating drives and connection modules enable flexible and efficient electrical installation and therewith a competitive advantage. Furthermore, all electrical connection ports required in the sector may be covered therefore. It is also easily possible to replace or upgrade connection ports. Scaling of the actuating drives with respect to the connection ports is therefore possible. Since different connection ports may be used in one actuator, the actuators can be manufactured at optimal costs (economies of scale).

Actuating drive, comprising a housing, which has a first housing part and a second housing part, wherein the two housing parts each have an edge, each edge having an end face, and wherein the two end faces face each other when the two housing parts are joined, wherein the first housing part and the second housing part can be detachably and directly joined or joined with a seal, wherein the actuating drive is designed to accommodate an exchangeable connection module for a cable feed, wherein the exchangeable connection module can be inserted into an opening of the first edge of the first housing part and wherein the exchangeable connection module can be connected in a form-closed manner to the end faces of the edges in a region of the opening when the two housing parts are joined. Thus, an actuating drive, in particular for ventilation flaps or fire dampers, having high flexibility in the electrical connection contacting is provided.

LIST OF REFERENCE CHARACTERS 1 actuating drive
2, 3 housing part
4, 5 edge
6, 7 end face
GH housing
A1, A2 connection
AN1-AN14 opening
AN6', AN7', AN10', AN11' opening
AM1-AM3 connection module
AM2'-AM3' connection module
AM41, AM41', AM41", AM51 first connection module part
AM42, AM42', AM42", AM52 second connection module part
K1, K2 cable
AK1-AK4, AK3' electrical connecting contact
SG actuator
ACH axle
DR sealing ring
SR screw
W1-W5 bead
N1-N4 groove
R1, R1', R1", R1'" rib
R2, R2', R2", R2'" rib

The invention claimed is:

1. An actuating drive, comprising:
  a housing having a first housing part and a second housing part, said first and second housing parts each having a side including a first side having an opening formed therein and a second side, each said side having an end face, said two end faces face each other when said first and second housing parts are joined, said first housing part and said second housing part being detachably joined; and
  a plurality of exchangeable connection modules for a cable feed, said plurality of exchangeable connection modules having different constructions from one another, each of said plurality of exchangeable connection modules for being selectively inserted into said opening of said side of said first housing part and each of said plurality of exchangeable connection modules being connected in a form-closed manner to said end faces of said sides in a region of said opening when said first and second housing parts are joined.

2. The actuating drive according to claim 1, wherein a groove-bead connection is used for insertion of each of said plurality of exchangeable connection modules, said end faces of said first and second sides form a peripheral bead in the region of said opening and for insertion into said opening, each of said plurality of exchangeable connection modules having a peripheral groove formed therein for accommodating said peripheral bead in a form-closed manner, each of said plurality of exchangeable connection modules having a first rib and a second rib defining said peripheral groove, after insertion of one of said plurality of exchangeable connection modules and joining of said first and second housing parts, said first rib borders a housing interior and said second rib rests on said housing to an outside.

3. The actuating drive according to claim 2, wherein said second rib is formed by a body of one of said plurality of exchangeable connection modules.

4. The actuating drive according to claim 1, wherein said second side of said housing part has an opening formed therein for jointly accommodating each of said plurality of exchangeable connection modules together with said opening of said first side.

5. The actuating drive according to claim 1, further comprising a cable permanently installed in the actuating drive and fed through an inserted one of said plurality of exchangeable connection modules.

6. The actuating drive according to claim 1, wherein one of said plurality of exchangeable connection modules is configured as an insertable terminal with a series of connecting contacts for connecting electrical components in said housing.

7. The actuating drive according to claim 6, wherein said connecting contacts are coupled as a daisy chain connection.

8. The actuating drive according to claim 1, wherein one of said plurality of exchangeable connection modules is configured as an insertable screw terminal.

9. The actuating drive according to claim 1, wherein one of said plurality of exchangeable connection modules is configured in two parts including a first part being inserted into said housing in a form-closed manner in said region of said opening and has a socket for a plug-in connection on a housing outer part, and a second part being a pluggable screw terminal having a mating connector complementary with said socket.

10. The actuating drive according to claim 1, wherein one of said plurality of exchangeable connection modules has two parts including a first part being inserted into said housing in a form-closed manner in said region of said opening and has a socket for a plug-in connection on a housing outer part, and a second part configured as a pluggable terminal having a mating connector complementary with said socket, wherein said pluggable terminal is injected on to a fed cable by way of an electrically insulated plastics material.

11. The actuating drive according to claim 1, further comprising a circuit carrier having contact elements, wherein said contact elements are configured with contact elements of each of said plurality of exchangeable connection modules that are complementary therewith for enabling electrical contacting on insertion of said exchangeable connection module.

12. The actuating drive according to claim 1, wherein a groove-bead connection is used for insertion of each of said plurality of exchangeable connection modules, said end faces of said sides have a peripheral groove formed therein in said region of said opening and for insertion into said opening, each of said plurality of exchangeable connection modules has a peripheral bead for insertion in a form-closed manner into said peripheral groove, wherein said peripheral groove is formed by a first rib and a second rib, wherein said first rib rests on a housing interior and said second rib on a housing exterior.

13. A configuration for a drive of actuators, the configuration comprising:

an actuating drive containing:

a housing having a first housing part and a second housing part, said first and second housing parts each having a side including a first side with an opening formed therein and a second side, each said side having an end face, and said two end faces face each other when said first and second housing parts are joined, said first housing part and said second housing part being detachably joined; and a plurality of connection modules for a cable feed to said actuating drive, said plurality of exchangeable connection modules having different constructions from one another, each of said plurality of connection modules for being selectively inserted into said opening of said first side of said first housing part and each of said plurality of connection modules for being connected in a form-closed manner to said end faces of said sides in a region of said opening by joining said first and second housing parts.

* * * * *